United States Patent
Luechinger

(12) 
(10) Patent No.: US 8,685,789 B2
(45) Date of Patent: Apr. 1, 2014

(54) RIBBON BONDING IN AN ELECTRONIC PACKAGE

(75) Inventor: Christoph B. Luechinger, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 615 days.

(21) Appl. No.: 12/776,199

(22) Filed: May 7, 2010

(65) Prior Publication Data

US 2010/0214754 A1 Aug. 26, 2010

Related U.S. Application Data

(60) Continuation of application No. 11/675,534, filed on Feb. 15, 2007, now Pat. No. 7,745,253, which is a division of application No. 10/429,128, filed on May 2, 2003, now abandoned.

(51) Int. Cl.
*H01L 21/00* (2006.01)

(52) U.S. Cl.
USPC .................................. 438/106; 257/E21.499

(58) Field of Classification Search
USPC .......... 438/111, 113, 460, 106; 257/666, 139, 257/329, 334, 341, 401, 675, 691, 696, 698, 257/724, 728, 735, 796, E23.033, E23.044, 257/E21.499
See application file for complete search history.

(56) References Cited

U.S. PATENT DOCUMENTS

| | | |
|---|---|---|
| 4,686,492 A | 8/1987 | Grellmann et al. |
| 4,824,005 A | 4/1989 | Smith, Jr. et al. |
| 5,097,100 A | 3/1992 | Jackson |
| 5,313,365 A | 5/1994 | Pennisi et al. |
| 5,646,450 A | 7/1997 | Liles et al. |
| 5,894,983 A * | 4/1999 | Beck et al. ................. 228/110.1 |
| 6,040,626 A * | 3/2000 | Cheah et al. .................. 257/735 |
| 6,157,080 A | 12/2000 | Tamaki et al. |
| 6,336,269 B1 | 1/2002 | Eldridge et al. |
| 6,441,483 B1 * | 8/2002 | Akram ........................... 257/724 |
| 6,442,033 B1 | 8/2002 | Liu et al. |
| 6,520,399 B1 * | 2/2003 | Salzer et al. ............... 228/110.1 |
| 6,747,342 B1 * | 6/2004 | Planey .......................... 257/666 |
| 6,778,406 B2 | 8/2004 | Eldridge et al. |
| 6,946,324 B1 | 9/2005 | McLellan et al. |

(Continued)

FOREIGN PATENT DOCUMENTS

DE 42 32 745 A1 3/1994
EP 0 408 272 A2 1/1991

(Continued)

OTHER PUBLICATIONS

Bradley K. Benton, "Ribbon Bonding," Advanced Packaging, IHS Publishing Group, US, vol. 8, No. 3, Mar. 1999, pp. 24-26, XP-000803305, ISSN 1065-0555.

(Continued)

*Primary Examiner* — Vongsavanh Sengdara
(74) *Attorney, Agent, or Firm* — Haynes and Boone, LLP

(57) ABSTRACT

A flexible conductive ribbon is ultrasonically bonded to the surface of a die and terminals from a lead frame of a package. Multiple ribbons and/or multiple bonded areas provide various benefits, such as high current capability, reduced spreading resistance, reliable bonds due to large contact areas, lower cost and higher throughput due to less areas to bond and test.

25 Claims, 7 Drawing Sheets

(56) References Cited

U.S. PATENT DOCUMENTS

| | | | |
|---|---|---|---|
| 2002/0163040 A1 | 11/2002 | Kinzer et al. | |
| 2004/0014309 A1* | 1/2004 | Nakanishi | 438/614 |
| 2008/0169537 A1 | 7/2008 | Kajiwara et al. | |

FOREIGN PATENT DOCUMENTS

| | | |
|---|---|---|
| JP | 2000-114445 A | 4/2000 |
| JP | 2000-183099 A | 6/2000 |
| JP | 2002-313851 | 10/2002 |
| JP | 2002-314018 | 10/2002 |
| WO | WO02/086970 | 10/2002 |

OTHER PUBLICATIONS

Bruce L. Gehman, "Bonding Wire Microelectronic Interconnections," IEEE Transaction on Components, Hybrids, and Manufacturing Technology, IEEE Inc. New York, US, vol. CHMT-3.

Mark Klossner & Steve Babinetz, "Assembly Solutions for 3-D Stacked Devices," Proceedings, Semicon Sinpapore 2002, pp. A1-A10, XP002310158.

Ivy Wei Qin et al, "Automatic Wedge Bonding with Ribbon Wire for High Frequency Applications," 27th IEEE/CPMT International Electronics Manufacturing Technology, pp. 97-104.

Ivy Wei Qin, "Wire Bonding: the Preferred Interconnect Method"; XP-002355238, Chip Scale Review; chipscalereview.com/archives/ES/issues/1102/f5_01.php.

Jesus Noel Calata et al.; "Evaluation of Interconnect Technologies for Power Semiconductor Devices"; 2002 Inter Society Conference on Thermal Phenomena; pp. 1089-1096; 2002.

Ivy Wei Qin et al, "Wedge Bonding for Ultra Fine Applications," 2Advanced Packaging Technologies Seminar; 2001; pp. A1-A10.

Japanese office action dtd Feb. 19, 2013.

* cited by examiner

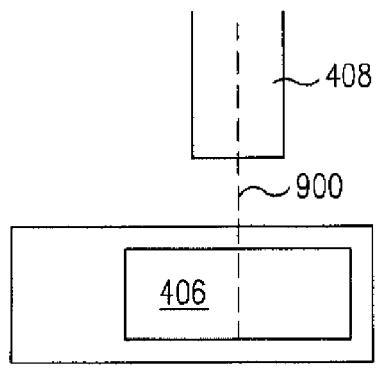
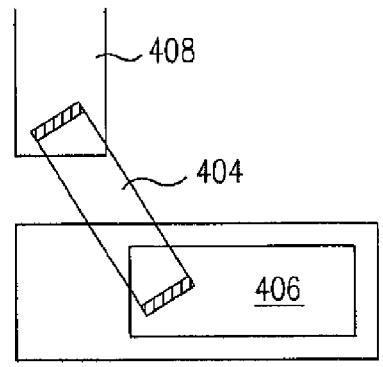
FIG. 9A  FIG. 9B
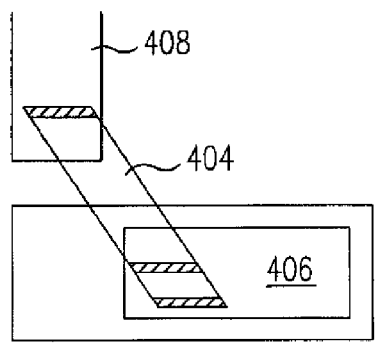
FIG. 9C

RIBBON BONDING IN AN ELECTRONIC PACKAGE

CROSS REFERENCE TO RELATED APPLICATIONS

This is a continuation application of U.S. patent application Ser. No. 11/675,534, filed Feb. 15, 2007, which is a divisional application of U.S. patent application Ser. No. 10/429,128, filed May 2, 2003, now abandoned.

BACKGROUND

1. Field of the Invention

The present invention relates to semiconductor devices, and in particular, to interconnecting a semiconductor die to a terminal lead in a semiconductor package.

2. Related Art

In the manufacture of semiconductor devices, active elements in a semiconductor device, such as drain and/or source regions in a semiconductor die, are electrically connected to other devices or electronic components, such as on a printed circuit board. However, since semiconductor devices can be susceptible to environmental conditions, such as dust, moisture, and sudden impact, which can damage or otherwise interfere with the proper operation of the device, the device is typically protected by a die package. The die package both protects the die and allows the die to electrically connect to external devices. To facilitate the latter, specific portions of the die are electrically coupled to external leads of the package or lead frame, such as with bond wires or solder balls.

FIG. 1 shows a side view of a typical connection between a power semiconductor die 10 (e.g., a MOSFET) and part of a lead frame 12. Lead frame 12 includes a lead 14 and a die pad 16. Lead 14 allows die 10 to electrically couple external elements after die 10 is connected. Die 10 is mounted on or secured to die pad 16. The upper surface of die 10 includes a metalized portion 22, such as aluminum, that provides contact with underlying active elements of die 10. An electrical connection is then made between metalized portion 22 and contact portion 18. Typically, the connection is made by bonding, e.g. ultrasonically bonding, a conductive wire 24 between the two portions. Materials for wire 24 include gold, aluminum, and copper. FIG. 1 shows a single bond, connection, or stitch 26 between wire 24 and metalized portion 22.

The amount of current flow from die 10 to lead 14 depends, in part, on the total resistance in the current path, as shown by the arrows in FIG. 1. This resistance is due, in part, to the resistance of wire 24 and the spreading resistance along metalized portion 22. The spreading resistance increases as the distance the current has to travel from the metalized portion to the stitch increases. The spreading resistance also increases as the thickness of metalized portion 22 decreases. Typical metalization thickness is in the range of approximately 3 to 5 microns (i.e., much smaller than the wire thickness). It is desirable to lower the overall electrical resistance of the connections, especially to keep pace with the intrinsic resistance of the semiconductor die, which is continuously decreasing. However, increasing the thickness of metalized portion 22 also increases the cost by decreasing throughput of the wafer/die manufacturing process.

Further, wires are limited by their size, typically around 20 mil in diameter, which also limits the amount of current that can be carried in each wire. Consequently, large numbers of wires are sometimes needed to make the desired connections in certain applications, which can increase the cost and decrease throughput of the interconnect process equipment (e.g., the wire bonder).

Instead of wires, other types of bonding utilize a strap to connect the die to the lead frame. One such configuration is shown in FIG. 2 and is disclosed in U.S. Pat. No. 6,040,626, entitled "Semiconductor Package", issued to Cheah et al. A single conductive strap 50, e.g., copper, is used to obtain an electrical connection between metalized portion 22 on die 10 and lead 14 of the package/module. Strap 50 can be either soldered or glued to two contact areas 52 and 54, such as with an electrically conductive epoxy or solder paste 56. Use of a strap provides the advantages of reducing resistance to current flow by providing a large contact area for coupling metalized portion 22 to lead 14, e.g., spreading resistance is greatly reduced.

However, using a strap also has disadvantages. In order to solder strap 50 to the surface of metalized portion 22, a solderable metalization, e.g., copper or nickel, is required. In general, such a metalization requires a stack of several different metal layers (not shown), with each layer having a specific function, e.g., adhesion, barrier, and solderability, of the soldering process. These layers, which are different than the standard metalization layer, e.g., aluminum, together result in higher manufacturing cost of the metalization, and consequently of the semiconductor die. Typically, a solder paste process is applied to join the parts. Solder paste 56 contains some type of flux component, which is required to (1) temporarily tack the components, (2) protect them from oxidizing (especially if the reflow process takes place in air), and (3) remove/reduce oxides already present. Depending on the quality of the parts, only the use of a strong flux provides a robust process and reliable result of the soldering process. It is well known that flux residues cover the surfaces after reflow. Beside other negative effects (like corrosion in contact with humidity), their presence negatively influences the strength and reproducibility of the adhesion of the molding compound in a subsequent package encapsulation. This again can result in a limited reliability of such parts. As a consequence, parts processed with solder paste typically need to be thoroughly cleaned after reflow and before further processing/packaging.

However, cost effective wet chemical cleaning processes are known to offer limited process control capability, causing an increased yield loss potential, beside the additional costs (e.g., labor, floor space, equipment, consumables, and yield loss) due to the need for this additional process step. Such a cleaning is also difficult to automate (which would reduce labor cost) and difficult to implement in a clean room environment. Furthermore, wet chemical processes, as well as solder reflow using flux (fumes), may be environmentally unfriendly. Two other disadvantages of a copper strap interconnect are (1) limited flexibility (since the straps are typically stamped on the die bonder, device changes which require a different strap geometry will require exchanging the stamping tool, which increases time and cost) and (2) the relatively stiff copper strap can form a significant stress on the silicon die, which can cause the die to crack, especially if the thickness of the attachment layer (e.g., solder or epoxy) is not well controlled above a certain minimum.

Another type of interconnect currently used is a solder ball based interconnect, such as disclosed in U.S. Pat. No. 6,442,033, entitled "Low-cost 3D Flip-chip packaging technology for integrated power electronics modules", issued to Liu Xingsheng et al., and in U.S. Pat. application publication No. US 2002/0066950, entitled "Flip chip in leaded molded package with two dice", by Rajeev Joshi, both of which are incorporated by reference in their entirety. Solder ball based interconnects have similar disadvantages to those of the strap configuration with regards to the use of solder paste and inflexibility. In high current applications, such a configuration has the additional disadvantage of the solder's high susceptibility to electromigration.

Thus, it is highly desirable to use a clean, environmentally friendly process, which can be well controlled, as well as a flexible interconnect. The ultrasonic bonding process is one such process. However, it is also desirable to reduce the number of connections, in order to increase the production rate of existing equipment, and reduce the cost of manufacturing. Furthermore, it is desirable to improve the electrical performance of connections, which would require either reducing the electrical resistance and/or increasing the current capability, depending on the type of application. Especially for discrete semiconductor devices, it is also desirable to reduce the overall size of a device, and therefore the volume required by the connection.

Accordingly, there is a need for an improved type of connection processed using ultrasonic bonding, which overcomes the deficiencies in the prior art as discussed above.

SUMMARY

According to one aspect of the present invention, a flexible conductive ribbon is used to electrically connect a die and an external lead in a package, such as for power applications and MOSFETs. The connection to the die is by ultrasonic bonding in one embodiment. Bonding of the lead may also be by ultrasonic bonding. Other embodiments may utilize thermosonic bonding. The ribbon is of a rectangular cross-section and can be of a single layer, such as aluminum or copper, or can be of multiple layers, such as a thin aluminum bonding layer underlying a thicker copper conducting layer. In some embodiments, a single ribbon is used, while in other embodiments, multiple parallel ribbons are bonded. Further, each ribbon can have one or more stitches or bonds on the conductive die surface with one or more loops.

The present invention allows using the same bonding process as with wires, i.e., an ultrasonic bonding process, increasing the cross section and contact area for the current paths while limiting or even reducing the overall volume occupied by the connection, and reducing the processing steps and time to produce the connection. Using a ribbon of the present invention allows the main loop cross section to be maximized since gaps between wires are filled. Even though the ribbon has a large cross section, the thickness can still be reduced compared to a wire, which makes bonding by ultrasonic processes less difficult. Consequently, bonding is easier, the loop height can be lowered, which results in lower interconnect height and a potential for reduced package height for smaller packages, and the ability to form the loops increases, which results in shorter loops and more stitches. Multiple stitches allow using smaller bond areas (per stitch), which alleviates the need for a heavy bond head to generate and apply high force and ultrasonic power during bonding. Thus, yields higher throughput. The use of multiple stitches, leading to shorter distances between stitches, reduces the spreading resistance, which allows higher current carrying capability.

In other embodiments, the ribbon can be bonded and cut at different angles, depending on the orientation of the contacts of the die and lead terminals. This allows optimal usage of the ribbon contact area, maximizes ribbon width, and allows placing a large ribbon in existing packages designed for round wire bonding (e.g., TO-220 packages) in an optimized manner.

This invention will be more fully understood in conjunction with the following detailed description taken together with the following drawings.

BRIEF DESCRIPTION OF THE DRAWINGS

FIG. 9A shows a top view of a connection between a die and a lead frame where the contacts are aligned;

FIG. 9B shows a top of a connection between a die and a lead frame where the contacts are not aligned using a conventional process;

FIG. 9C shows a top view of the contact alignment of FIG. 9B using an embodiment of the present invention;

Use of the same or similar reference numbers in different figures indicates same or like elements.

DETAILED DESCRIPTION OF THE PREFERRED EMBODIMENTS

According to one aspect of the present invention, one or more conductive flexible ribbons are used to electrically connect a semiconductor die to a lead frame.

Figure 1:
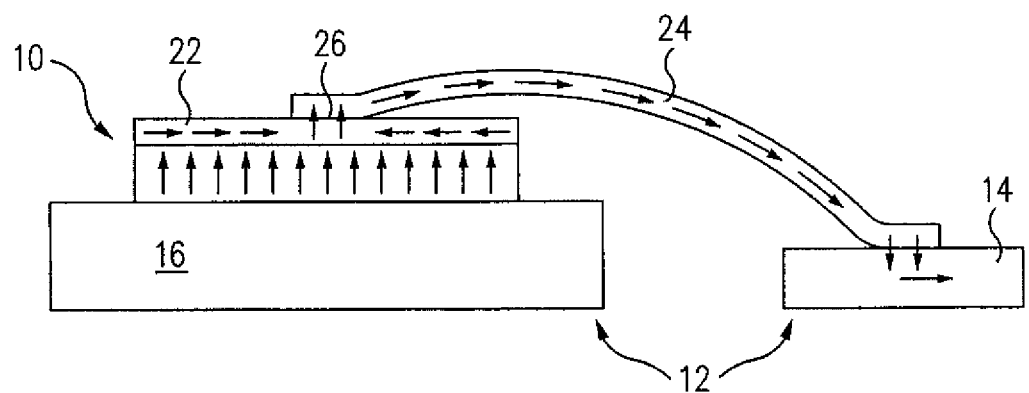
FIG. 1 shows a side view of a conventional connection between a die and a lead frame using a wire with a single stitch.
Figure 2:
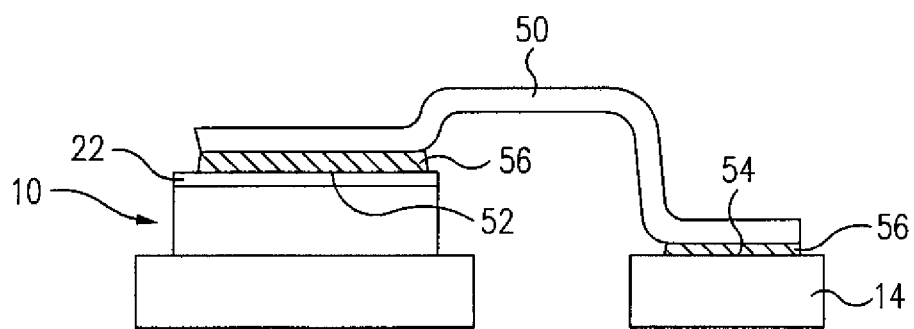
FIG. 2 shows a conventional connection between a die and a lead frame using a strap.
Figure 3A:
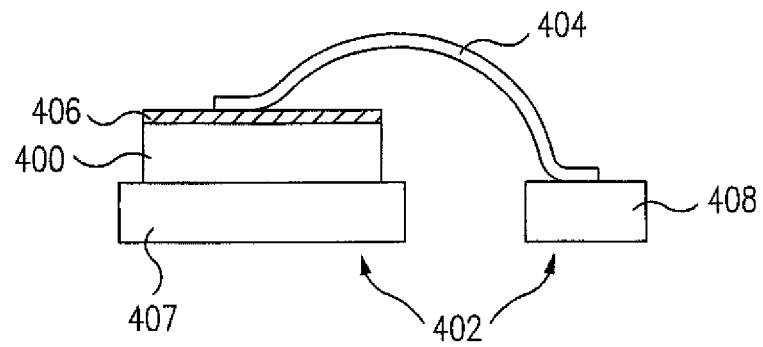
FIGS. 3A and 3B show side and top views, respectively, of a connection between a die and a lead frame according to one embodiment of the invention.
Figure 3B:
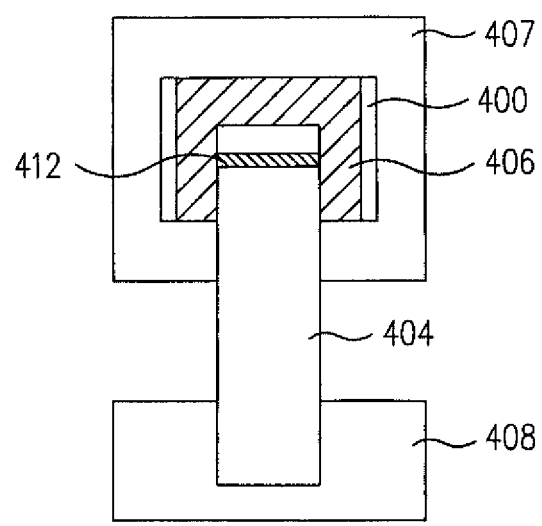

FIGS. 3A and 3B show a side view and top view of a semiconductor die 400 coupled to a lead frame 402 by a conductive flexible ribbon 404, according to one embodiment of the invention. Die 400 includes a metalized portion 406, such as aluminum, that provides connection to underlying elements of die 400. Die 400, in one embodiment, is part of a power semiconductor device, such as a power MOSFET. Lead frame 402 includes a support portion 407 to which die 400 is secured, e.g., by solder or epoxy, and terminals 408 that allow electrical connection to external devices. An enclosure, covering, or package protects the die from external elements. In some embodiments, the semiconductor package is a TO-220 or an SO-8 package.

Ribbon 404, which may have a rectangular cross section, is aluminum, although other conductive metals, such as copper, are also suitable. In one embodiment, the mechanical properties of ribbon 404 are similar to that of wire. For example, a 60 mil×8 mil aluminum ribbon may have a tensile strength of approximately 2000 g. The width of ribbon 404 may range from 20 mil to 100 mil or more. In one embodiment, the width is 120 mil. Larger width ribbons generally are able to replace larger numbers of wires. For example, a single 120 mil ribbon may replace five 20 mil wires. The thickness of ribbon 404 may range from 2 mil to 10 mil or more. In one embodiment, the thickness is 12 mil. Thicknesses of 2 mil require precise cutting control so that the ribbon can be cut while not cutting into the substrate. Note that lower thicknesses may be possible with improved equipment and processes. Some typical sizes of ribbon 404 are 20 mil×2 mil, 20 mil×4 mil, 30 mil×3 mil, 40 mil×4 mil, 50 mil×5 mil, 60 mil×8 mil, 80 mil×6 mil, 80 mil×8 mil, 80 mil×10 mil, and 100 mil×10 mil. Aspect ratio (width/thickness), in one embodiment, is between 7 and 13, with a typical ratio of approximately 10. An aspect ratio of approximately 10 has been shown to provide a good compromise between bondability (the thinner the better) and tilt sensitivity (the thicker the better). Those skilled in the art will appreciate that other sizes of ribbon may also be suitable, depending on factors such as system requirements and process technology.

Ribbon 404 is bonded to metalized portion 406 by an ultrasonic bonding process, as is known by those skilled in the art, and is disclosed, e.g., in commonly-assigned U.S. Pat. No. 4,824,005, entitled "Dual mode ultrasonic generator in a wire bonding apparatus" to Smith, Jr. and U.S. Pat. No. 6,439,448, entitled "Large Wire Bonder Head" to Ringler, both of which are incorporated by reference in their entirety. Ultrasonic bonding is more environmentally friendly, cleaner, less expensive, and easier to control than soldering. However, ultrasonic bonding becomes more difficult as the thickness of the wire or ribbon increases. In the case of a wire, small diameter wires can be used, but a larger number of wires are needed to obtain the same cross section, thereby resulting in lower productivity and higher cost.

The relatively small thickness of ribbon 404 (e.g., 2 to 10 mil) allows ultrasonic bonding, while a large width (e.g., 20 to 100 mil) allows a large bonding area. The small thickness of ribbon 404 also provides flexibility so that, within a given area of metalized portion 406, the number of bonds or stitches can be increased and the length of ribbon between bonds can be decreased. This can be advantageous, as will be discussed in more detail below.

Referring to FIG. 3B, ribbon 404 is ultrasonically bonded, in one embodiment, to metalized portion 406 along an area 412, although the actual bond may be smaller. The ultrasonic bonding is by conventional processes, e.g., with frequencies around 60 kHz. However, variations of current ultrasonic bonding processes are also suitable. For example, ultrasonic bonding can be at a frequency higher than 60 kHz, e.g., around 80 kHz, which provides higher reproducibility of the resulting bond and requires a smaller vibration amplitude from the bond tool. In other embodiments, ribbon 404 is thermosonically bonded to metalization portion 406. There are trade-offs in using thermosonic bonding, such as additional complexities and costs associated with heating a substrate and bonding on the heated substrate versus lower ultrasonic power requirements and a more forgiving process.

Referring back to FIG. 3B, area 412 is approximately the width of ribbon 404 and approximately twice the thickness of ribbon 404 in one embodiment. In other embodiments, the length of area 412 is less than twice the thickness of ribbon 404, but more than the thickness of ribbon 404. In some embodiments, the actual bond from the ultrasonic bonding is at least as large as the area of the cross-sectional area of ribbon 404. A bond tool for a larger (longer) bonded area 412 allows achieving a bond of sufficient length (i.e., at least as long as the thickness of the ribbon) even with less than optimal ultrasonic bonding parameters. Further, the actual bond area is of the same magnitude as the bond area for wire bonding, and thus, comparable force (bond) and power capability (ultrasonic) to wire bonding can be used for ultrasonic bonding ribbon 404. Typically, sufficient current flow is obtained when the actual bond area is at least approximately the size of the ribbon's cross section.

In general, performance and processability increase as the width of ribbon 404 increases. However, the width is limited by various factors, such as the ultrasonic bonding process, reliability of the bond, and the type of package. For example, the width of the ribbon and its aspect ratio must be limited depending on the tilt of the bond surface relative to the bond tool. Stress and strain caused by a thermal expansion mismatch between the ribbon and the substrate increase with increasing size of the bonded area, progressively limiting the fatigue failure lifetime of a bond with increasing maximum linear dimension. The critical linear dimension is the length of the diagonal of the rectangular bond area. The severity of this limitation depends on the type of package and the type of application. It will be less severe in a plastic molded discrete package, but more pronounced in an electronic module (which is typically filled with silicon gel only to achieve protection against oxidation and corrosion). However, as long as the maximum dimension is comparable, e.g., within ±50%, with the maximum dimension of the bond area of a large wire, this limitation is expected to be comparable to the one for a round wire bond because the largest dimension is still of similar size.

Figure 4A:
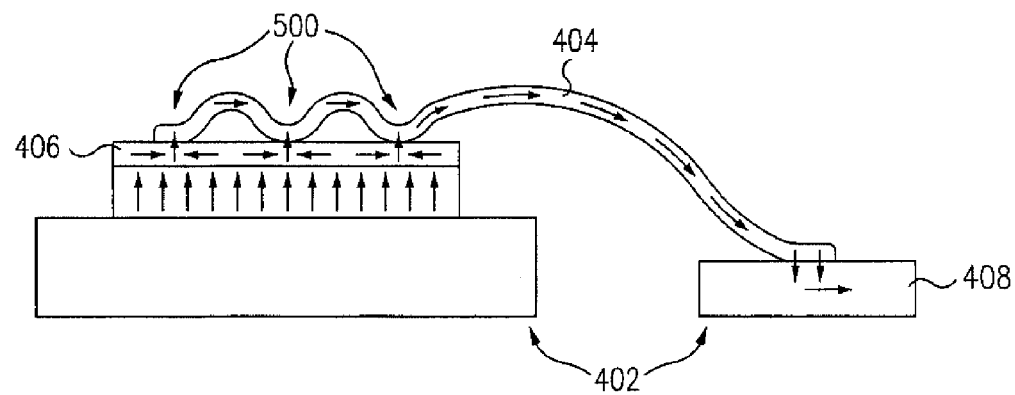
FIG. 4A is a side view of a connection between a die and a lead frame using a ribbon with multiple stitches according to another embodiment.

FIG. 4A is a side view showing another embodiment of the present invention in which multiple bonds or stitches 500 are used to contact ribbon 404 to metalized portion 406. Stitches 500 are formed using ultrasonic bonding in one embodiment. Multiple stitches reduce spreading resistance along metalized portion 406. As seen from FIG. 4, the shorter the distance between stitches 500, the less distance current has to travel in the metalization with high electrical resistance, resulting in less spreading resistance and higher current flow to terminals 408 of lead frame 402. In one embodiment, the number of stitches is between 2 and 6, although a single stitch may also be used. The distance between stitches 500 depends on various factors, such as the size of ribbon 404, the ribbon bonding process, and requirements of the resulting device. For example, thinner ribbons allow the distances to be shorter, due in part to increased flexibility. In one embodiment, the distance between stitches (center-to-center of the stitches) for an 80 mil×8 mil ribbon is between approximately 1.25 mm and 2 mm, and for a 40 mil×4 mil ribbon, the distance may be reduced down to 0.6 mm.

Figure 4B:
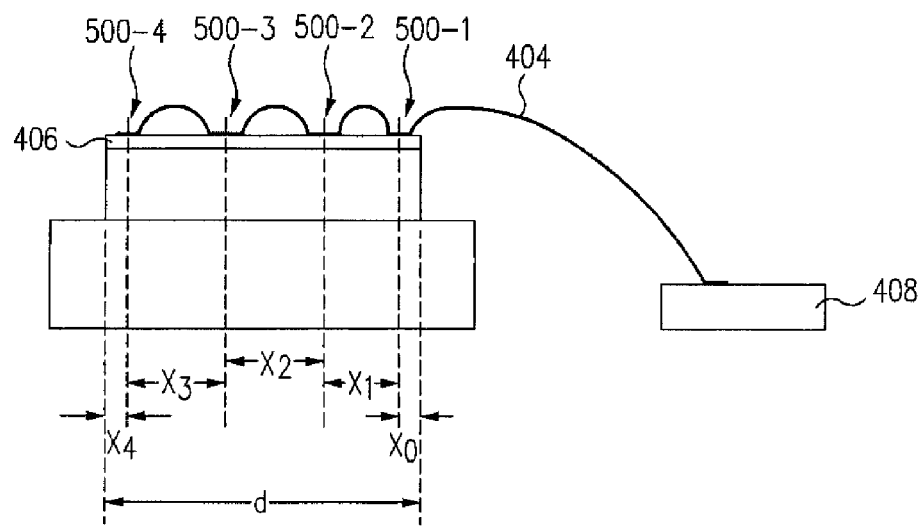
FIG. 4B is a side view of a ribbon with multiple stitches, showing spacing between stitches according to one embodiment.

FIG. 4B is a side view of an embodiment with multiple stitches for illustrating stitch placement on the die. Ribbon 404 is a single wide ribbon (approximately the width of metalized portion 406) or one of multiple parallel ribbons. Distances $x_0$, $x_1$, $x_2$, $x_3$, and $x_4$ are as shown, where $x_0+x_1+x_2+x_3+x_4=d$ (the length of metalized portion 406). Note that only four stitches 500-1 to 500-4 are shown, although other numbers are also possible. Further, the distances $x_0$ to $x_4$ are not shown to scale, as different embodiments will yield different distances. In one embodiment, the distances $x_0$ and $x_4$ (from the center of the stitches at the ends of the die to the edge of the die) are approximately half the distance of the center-to-center distance of the interior stitches, i.e., $x_1=x_2=x_3=2x_0=2x_4$. Placement in this manner, to a first approximation, minimizes the maximum distance between any point on metalized portion 406 and the nearest bond or stitch 500. This approximation also assumes the resistance of each of the small loops (between stitches 500) is much less than the resistance of the main loop (between stitch 500-1 and terminal 408). The accuracy of the approximation increases as the number of stitches increases, i.e., a denser placement of stitches.

Among the stitches, resistance is lowest at stitch 500-1, resulting in the highest current flow and highest current density at stitch 500-1. Thus, in applications that are limited by the peak current, damage may appear at the first stitch, e.g., in the form of melting of die metalization and damage of the die due to too high a current density at the bond or stitch. Consequently, it would be desirable to place stitches 500 such that each stitch "sees" the same resistance or current flow. Thus, according to another embodiment, stitches 500 are placed such that the separation between stitches increases as the stitches move farther away from terminal 408. In one embodiment, $x_0 < x_1/2 < x_2/2 < x_3/2 < x_4$.

The distance may also be limited by the process in which ribbon 404 is bonded to metalized portion 406. For example, during the bonding process, ribbon 404 is fed through a bond tool, as will be described in more detail below, to the bond area, where ultrasonic bonding secures ribbon 404 to metalized portion 406. Additional ribbon 404 is then fed through the bond tool to form a loop and down to the next bond area. After the first bond, if the ribbon is looped back from the direction of the feed, a shorter distance to the next bond or stitch is possible. However, by looping the ribbon back, stress is placed on the new bond, which may damage or break the bond. Looping the ribbon forward in the same direction as the feed greatly reduces stress, but also makes the formation of a short loop more critical. In one embodiment, the ribbon is directed at an approximately 90° angle from metalized portion 406, which places a limited level of undue stress on the bond while also allowing a short distance between bonds. As will be appreciated by those skilled in the art, however, feeding the ribbon forward or backward at various angles may be the most desirable depending on the various factors such as the bonding equipment, the ribbon, and the device requirements.

There are also advantages to minimizing the height H of the ribbon loops. A lower height allows a smaller profile package, as well as reduced resistance for higher current flow. However, as with the distance limitation, the height is limited by the thickness of the ribbon as well as the bonding process. There is no upper limit of the loop height (within the range of typical dimensions of semiconductor packages or modules), but the lower the target loop height, the more challenging its control, i.e., to achieve a high reproducibility, the minimum loop height will depend on the thickness of the ribbon (via the influence on the stiffness with regards to bending the ribbon). In one embodiment, loop heights are 1.00 mm (from surface of the die to top surface of the ribbon) for 8 mil thick ribbons. However, depending on device requirements, loop heights can have other heights, such as 0.60 mm to achieve reproducibility or sufficient control of the loop height or 0.40 mm for an 8 mil thick ribbon to allow filling material (e.g., silicon gel in power modules and plastic mold in discrete power devices) still enough space to properly fill so that voids/bubbles do not form under the ribbon.

Factors other than device and/or process limitations may also determine the number of and distance between stitches on metalized portion 406. Even though shorter distances between stitches reduce the resistance and provide higher current, the larger number of stitches or loops also decreases throughput. For applications in which a high current is not critical, a higher throughput may be more desirable at the cost of lower current flow. In such a situation, a lower number of stitches or bonds would be formed. Therefore, the number of stitches and distance between stitches may vary depending on the device requirements.

Figure 5A:
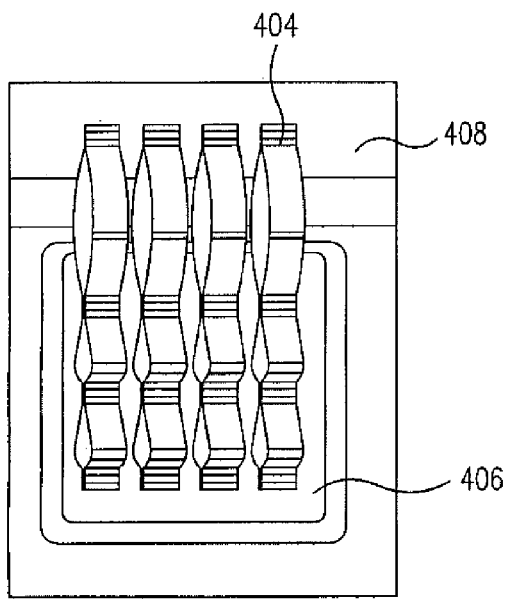
FIGS. 5A-5C show top views of another embodiment of the present invention using multiple parallel ribbons.
Figure 5B:
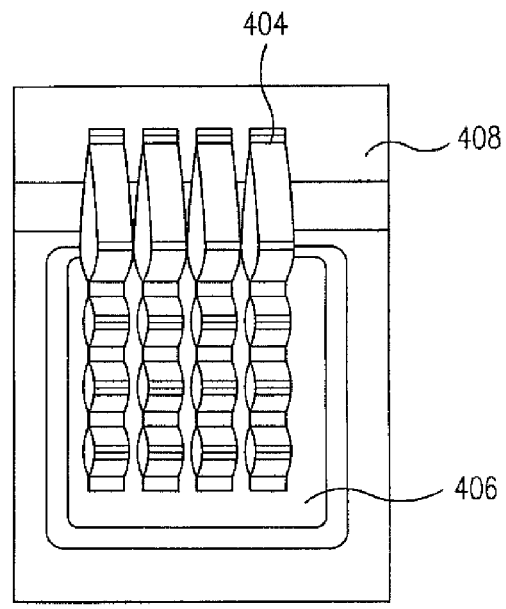
Figure 5C:
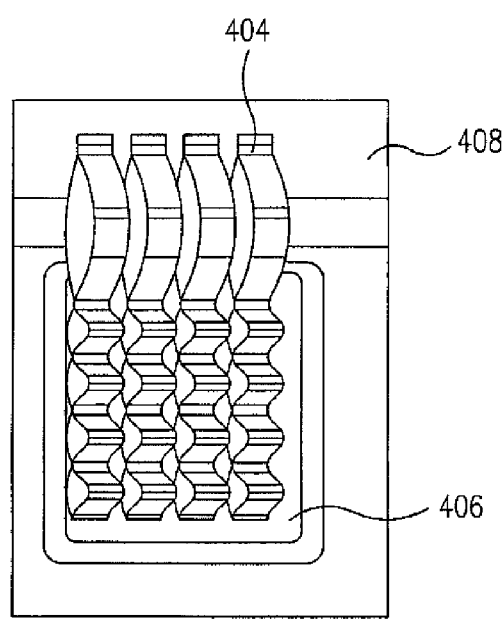

FIGS. 5A, 5B, and 5C show top views of another embodiment of the present invention, in which multiple ribbons 404 are used to connect metalized portion 406 to terminals 408. FIG. 5A shows four 60 mil×8 mil ribbons 404 with three stitches or bonds, FIG. 5B shows four 80 mil×8 mil ribbons with four stitches, and FIG. 5C shows four 80 mil×8 mil ribbons with five stitches. Higher current carrying capability or lower resistance is possible with multiple ribbons since the area from which the current to the bond is collected is reduced. In general, as the number of ribbons increases, the resistance decreases and current flow increases. However, as the number increases, the required width of the individual ribbons can decrease. Narrower ribbons are desirable when the device is subject to large temperature variations. This is because a smaller bond experiences less stress from coefficient of thermal expansion (CTE) effects, resulting in a more reliable bond. Thus, tradeoffs exist between having fewer wider ribbons versus having a larger number of narrower ribbons. As discussed above, a typical aspect ratio is approximately 10. Lower aspect ratios may also provide advantages over wires; however, as aspect ratios decrease (e.g., to 3 or less), the ribbon becomes to look and behave like a wire, thereby negating the advantages provided by ribbons.

Typically, as for a round wire, there is a CTE mismatch between the ribbon and the underlying silicon. For example, a copper ribbon may be desirable because copper has a lower resistance than aluminum and has a higher melting point. However, when the metalization is aluminum, which is softer than copper, bonding the copper ribbon to the aluminum layer may result in the bond extending through the aluminum layer and damaging the underlying silicon (this would be even worse for a round wire, due to the higher pressure). Therefore, in one embodiment, a copper plating or a metal plate is placed over the metalization layer. The metal plate should be a material having a CTE between that of silicon and the ribbon material, e.g., copper, to act as a stress/strain buffer. In one embodiment, the material is nickel-plated molybdenum. This eliminates the need to reduce spreading resistance, which results in the resistance mainly residing in the ribbon. A wide copper ribbon with one stitch provides a large bonding contact area for a reliable bond, while providing low resistance for current flow. Further, using a material having a closer CTE to the bond surface (copper) reduces the temperature effects on the strength of the bond.

Figure 6:
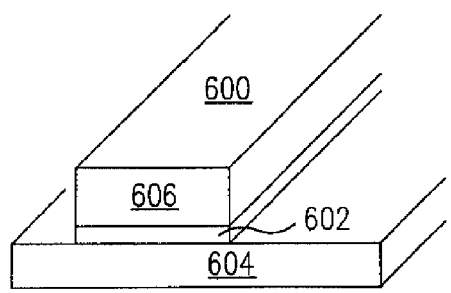
FIG. 6 shows a cross-sectional view of a clad ribbon according to one embodiment of the invention.

FIG. 6 shows a cross-sectional view of one embodiment of a clad ribbon 600 formed from a thin first conductive layer 602 and an overlying second conductive layer 606. First layer 602 is made of the same material as the underlying metalization layer 604 to which it is to be bonded. Properties of first layer 602 or bonding layer include increased bondability ("soft" so that underlying structures remain undamaged and easily bondable with ultrasonic processes), corrosion resistance, high electrical conductivity so that current can easy travel through this layer to reach second layer 606, and relatively low coefficient of thermal expansion (or near to silicon). In general, the latter two properties are somewhat less important than the first two. In one embodiment, aluminum is used for first layer 602 having a thickness of approximately 2 mil. Thus, two like-materials are bonded together (when the metalization is aluminum), which results in a stronger and more reliable bond.

Furthermore, since it is currently not possible to directly bond copper to aluminum metalization layers which overlie active circuitry, aluminum bond pads are typically moved to areas where there is no active circuitry underneath. This can allow bonding of thin (e.g., 2 mil) copper wires to aluminum metalization without the danger of damaging active elements underneath the aluminum. However, moving bond pads normally requires making the silicon die larger. Size of the silicon die is still the major cost factor in a semiconductor device. Therefore, the capability to bond copper over active circuitry with a high yield is very desirable, which can be accomplished using a clad ribbon with an aluminum layer between the metalization layer and the copper ribbon.

A thicker second layer 606 having higher thermal and electrical conductivities and lower resistance overlies first layer 602. Besides high conductivity, second layer 606 should also be corrosion resistant and have a low coefficient of thermal expansion. An additional property, sometimes not as important as the above, is to limit its hardness in order to not influence loop forming capability too much and to allow a good coupling between the layer and the bond tool. In one embodiment, second layer 606 is copper having a thickness of approximately 6 to 8 mil. Second layer 606 can have different thicknesses, depending, in some embodiments, on the thickness of first layer 602 such that the aspect ratio is within 7 and 13 (typically 10). Larger cross sections (greater thickness) will require higher ultrasonic power for bonding and therefore higher force to reach the necessary coupling between the bonding tool and the copper portion. Copper provides low electrical resistance and/or a strong/stiff and corrosion resistant loop. Other materials that may be suitable for second layer 606 include gold, which is much more costly, and a silver-nickel alloy.

A 2 mil aluminum bonding layer has been found to be suitable with current processes. Aluminum is desirable for ultrasonic bonding because it can be joined with many materials at room temperature, is easily bondable, and protects underlying active elements from possible damage from ultrasonic bonding. Its "softness" enables bonding to sensitive structures with high yield. While its electrical and thermal conductivities are high, they are still lower compared to some other materials like copper. However, while copper has higher electrical and thermal conductivities, it is relatively hard and difficult to bond. Thus, forming ribbon 600 with a thin aluminum layer between the copper and the aluminum metalization provides advantages of both the copper and the aluminum. In other embodiments, first layer 602 can be of a metal or bond material similar to but not exactly the same as the underlying metalization, which will still yield benefits, although not to the extent of using the same metal. In another embodiment, copper is used. Other embodiments may utilize a harder bonding layer than aluminum, such as in the case when the metalization underlying the active elements is formed of a harder material, such as copper.

Another design aspect of power interconnects is their reliability. Especially in power modules, the thermal mismatch at the bond interface, mainly caused by the large CTE difference between silicon and aluminum is a limiting factor. Theoretically, this could be drastically changed with the clad ribbon 600 discussed above, if the main ribbon material or thicker second layer 606 has a CTE nearer to the one of silicon. For example, since the CTE of copper (i.e., $\sim 17 \times 10^{-6}$ K$^{-1}$) is nearer to the one of silicon (i.e., $\sim 3 \times 10^{-6}$ K$^{-1}$) than aluminum (i.e., $\sim 24 \times 10^{-6}$ K$^{-1}$) so that the difference is $\sim 14 \times 10^{-6}$ K$^{-1}$ compared to $\sim 21 \times 10^{-6}$ K$^{-1}$, the reliability should be improved. Calculations have shown an approximate factor of two improvement. As an example, this offers the potential to improve the reliability in industrial power modules by approximately a factor two, a long-sought after improvement.

Figure 7:
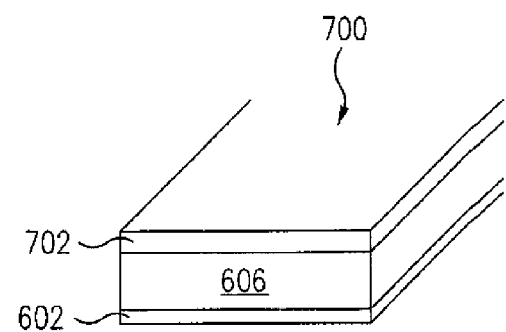
FIG. 7 shows a cross-sectional view of a clad ribbon with three layers according to another embodiment of the invention.

FIG. 7 shows another embodiment of a clad ribbon 700, in which a third layer of material 702 overlies second layer 606. As with the embodiment of FIG. 6, first layer 602 is of a bond material, e.g., conducive to ultrasonic bonding, and second layer 606 is of a conductive material, chosen for various aspects such as conductivity and flexibility. As the coupling between the bond tool and ribbon 700 is another key requirement (which determines the required force to a significant extent), it may be beneficial to include third layer (or bonding layer) 702, which is not necessarily identical to first layer 602 at the bottom. Third layer 702 would support an optimized coupling between the ribbon and the bond tool. Properties of third layer 702 or coupling layer are selected to have medium hardness, be corrosion resistant, have high electrical conductivity, and a low coefficient of thermal expansion, although typically the first two properties have greater importance than the latter two. However, this may change with different applications. In one embodiment, aluminum is used for third layer 702. Other materials may include copper, gold, and silver, although each has disadvantages. For example, copper is hard and gold and silver are more costly. The thickness of third layer 702, in one embodiment is between approximately 0.5 mil and 2 mil, with a typical thickness being 1 mil. First layer 602 and second layer 606 are similar to that described above with respect to the embodiment of FIG. 6.

One advantage of using a ribbon instead of a round wire in a clad configuration is that aluminum is more effectively utilized. For example, using a round wire with a copper core and an aluminum cylinder surrounding the copper, only the bottom portion of the aluminum is used for bonding when the wire is bonded and "flattened" against the metalization. Thus, the upper and side portions of the aluminum are not used to create the bond. However, using a ribbon, the aluminum is fully utilized during the ultrasonic bonding process. Accordingly, more copper (as a percentage of the total wire cross-section) can be used, resulting in a higher current carrying capability. The thickness of the clad layer of a ribbon can be chosen lower than for a wire (e.g., for a two layer or one-sided clad ribbon), because it has to deform much less (less than 1 mil, typically approximately 0.5 mil, according to observations/investigations).

Figure 8:
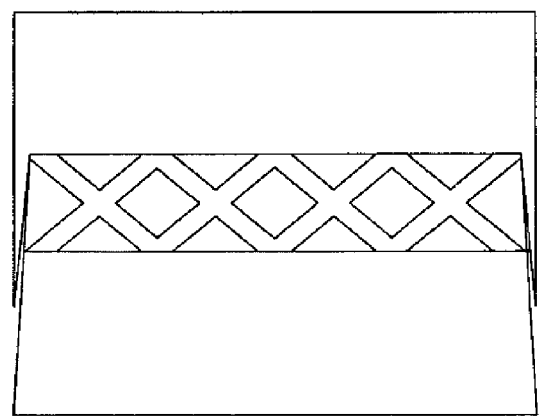
FIG. 8 shows a portion of a bond tool suitable for ribbon bonding according to one embodiment.

FIG. 8 shows one embodiment of a portion (the foot) of a bond tool for use in the present invention. The foot of the bond tool utilizes a cross groove structure and forms a diamond pattern, as shown. The depth of the grooves depends on the thickness of the ribbon. In one embodiment, the depth is between approximately 1.0 mil and 1.5 mil for an 8 mil thick ribbon. This pattern type increases the coupling surface between the tool and the ribbon during the bond process. The edges of the grooves also improve the immediate locking between the tool and the ribbon at the start of the bond process, reducing the slippage between the tool and the ribbon, and transferring the tool's motion into the ribbon and to the interface between the ribbon and the substrate. It is also expected that this diamond pattern slightly reduces the tilt sensitivity of the ribbon bonding. The bond surface should be well perpendicular to the bond tool; otherwise the load of the tool onto the ribbon is inhomogeneous, and bonding, then actually over-bonding, takes place only on one side of the ribbon. The diamond pattern limits the deformation on the side where the tool is nearer to the substrate (due to a limited perpendicularity), but because the tool still easier sinks into the material on that side of the ribbon, it will more likely also sink in to some extent on the other side, and transfer at least some energy. Thus, this type of pattern increases/maximizes contact area between the tool and the ribbon and minimizes damage to the ribbon heel. It has also been observed that using ribbons with aspect ratios of 10 provides an acceptable bond quality for tilt angles up to 1°.

In many packages, terminals 408 and metalized portion 406 are "aligned", as shown in FIG. 9A, along a line 900. Aligned, as used herein, means a majority of the bonding area of terminals 408 are within the area projected from the bonding area of metalized portion 406 perpendicular to one of its sides. In these types of packages (e.g., SO-8 packages), ribbon 404 is fed and bonded along line 900 and cut perpendicular to line 900. Here, the maximum width of ribbon 404 is limited by the lesser of the two widths of metalized portion 406 and terminal 408. However, other types of packages may have terminals 408 and metalized portion 406 that are offset from each other, such as shown in FIG. 9B. Using conventional ultrasonic bonding equipment and processes, ribbon 404 is bonded and cut perpendicular to the length of the ribbon, as shown in FIG. 9B. This may reduce the bonding area and width of the ribbon, as well as the number of stitches or bonds, since the area on terminal 408 and metalized portion 406 is not optimally utilized.

FIG. 9C shows one embodiment of the invention in which ribbon 404 is cut and bonded parallel to the intended bond area of terminal 408 and metalized portion 406. Using this configuration, bonding areas are more fully utilized so that wider ribbons can be used with more bonds. Conventional ultrasonic bonding equipment can be modified so that the bond tool is rotated. This allows the ribbon to be bonded and cut at different angles. By cutting and bonding in parallel with the bonding areas of the die and terminals, the ribbon width, bonding area, and/or number of stitches can be advantageously increased. Note that orientations other than parallel may also provide benefits over bonding with a fixed tool.

Angle bonding can be accomplished by making modifications to existing ultrasonic bonding equipment, such as described in commonly-assigned U.S. Pat. No. 4,976,392, entitled "Ultrasonic wire bonder wire formation and cutter system", which is incorporated by reference in its entirety. Angle bonding can be achieved by rotating the ribbon guide and the cutter relative to the bond tool or by rotating the bond tool alone (however then the cut is not parallel to the bond (tool)).

One way to achieve an angle bond is by rotating the bond foot of the tool relative to the transducer and wire guide. Although this way the orientation of the tool and therefore the setup is fixed and application specific, it does not mean any other additional effort. Of course the vibration characteristics will be different and a function of the angle, but this can be accommodated for. Also the cutter is rotated if a cut parallel to the bond is required. Such a setup is sufficient in most discrete power applications, where typically only one angle is required (see FIG. 9C). In a power module application, where there may be many more interconnects under different angles, a flexible solution may be required. This would allow adjusting the relative angle between bond foot and ribbon guide and cutter, thereby supporting the flexibility, which is the major strength of ultrasonic bonding compared to other interconnect techniques in such applications.

Figure 10:
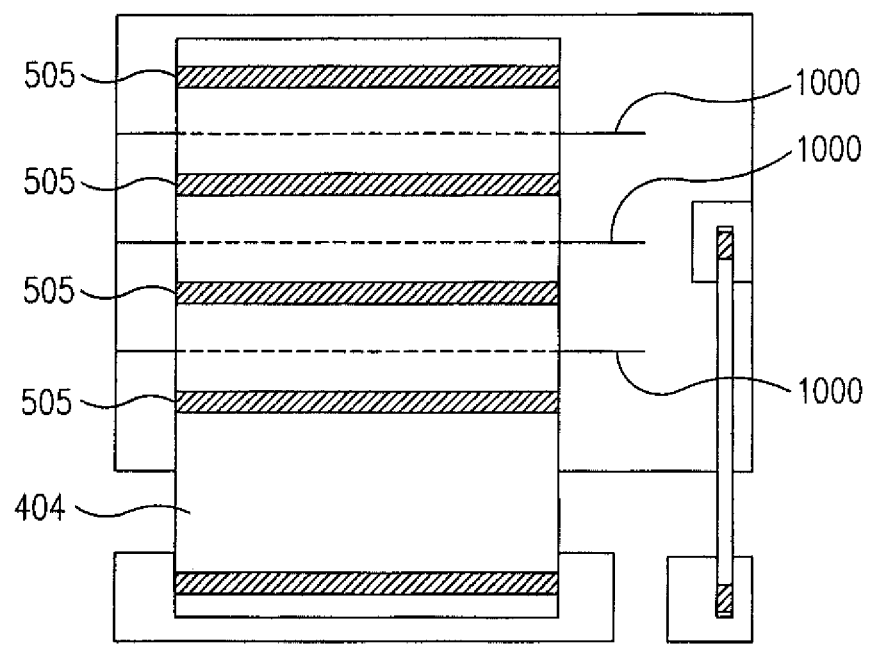
FIG. 10 shows a top view of a device with gate fingers where a ribbon has stitches between the gate fingers according to one embodiment.

FIG. 10 shows another embodiment of the present invention, in which ribbon 404 with multiple stitches 500 (of FIG. 5) is used with a device, such as a MOSFET die, with gate fingers 1000. Stitches 500 are bonded between gate fingers 1000. This eliminates the need to form an additional insulating layer over fingers 1000. One trend, also in power electronics (mainly discrete power MOSFET for DC-DC converter applications), is to higher switching frequencies. Higher frequency operation (e.g., >1 MHz) improves the efficiency in DC-DC converter applications and allows keeping passive components (e.g., inductors and capacitors) smaller.

To improve the switching behavior of a MOSFET, gate fingers are designed into the area of the source metalization (in order to reduce the distance between the gate and any point in the source to reduce the switching delay). These gate fingers interrupt the source metalization. For example, U.S. Pat. No. 6,040,626 describes how these fingers need to be covered with some electrically isolating material such that the clip attached to the source metalization does not create a short between the gate (finger) and the source metalization. If the gate finger arrangement is such that the stitches of a ribbon can be placed in between, the ribbon eliminates the need of this electrical isolation mentioned above.

Using a ribbon in higher frequency applications also provides advantages of the limited skin effect of ribbons compared to round wires. For example, the skin depth at 1 MHz is 3.1 mil for aluminum and 2.5 mil for copper. Since most of the current flows in a layer underneath the conductor's surface of thickness equal to the skin depth, the reduced cross section results in higher voltage loss and higher Joule heating. For a numerical example, in a 20 mil wire, only the outer ring of 3.1 mil thickness carries a significant amount of current. Its cross section is $$\left(\frac{\pi}{4}\right) \cdot (20^2 - 16.9^2) = 90 \text{ mil}^2$$

or approx. 90/314~29% of the total wire cross section. In contrast, for an 80 mil×8 mil ribbon, the cross section of the outer ring of 3.1 mil thickness (neglecting the short sides) is 2×80 mil×3.1 mil=496 mil² or 496/640~77.5% of the total ribbon cross section.

Although ribbons have been used in other applications, utilizing ribbons in connection with semiconductor dies and packages, such as high power applications and MOSFETs, has not been used for numerous reasons. For example, high frequency applications, such as microwave and opto-electronic, use ribbons for its improved high frequency capability. The rectangular cross section reduces the skin effect, low loops of appropriate shape result in low inductance of the interconnect, and the shape is more similar to the one of strip lines, resulting in lower reflection losses at the ends of the interconnect. High frequency applications desire ribbons that have large surface area (reducing skin effects) and loops with well defined geometry (small variance in inductance). This leads to single ribbons with single bonds, since spreading resistance is not an issue. Furthermore, ribbons used in these high frequency applications typically use gold as the ribbon material and processes the bonds with heating the substrate, i.e., it is a thermosonic process and not a pure ultrasonic process (i.e., without application of heat).

The use of ribbon bonding of the present invention yields numerous advantages. The extent of the productivity/throughput improvement will depend on the application. For example, in a medium power package (e.g., a TO-220 package), three parallel 20 mil aluminum wires with two stitches on the die each were replaced with one 80 mil×10 mil aluminum ribbon with three stitches on the die, for equal electrical performance. The productivity improvement increased by a factor of approximately 2.5, as the process time for such a ribbon with the design criteria (with regards to the size of the bond area) described is comparable to that of a single 20 mil wire. In a low power package (e.g., an SO-12 package), four 5 mil aluminum wires with a single stitch on the die were replaced with one 30 mil×3 mil aluminum ribbon with a single stitch on the die. The productivity improvement factor is approximately 4, as the process time for such a ribbon is comparable to that of a single 5 mil wire.

The present invention provides other features that may be beneficial. For example, ribbon bonding yields a higher stiffness in the substrate plane, thereby lowering sensitivity to vibrations in that direction. This may have advantages in automotive applications, where silicon gel used to fill the power modules exerts a significant force on wires under vibration. Other advantages may result from replacing multiple wires with a single ribbon or lower number of ribbons. For example, it is common to pull-test wires after bonding to determine the quality of the bond. As the number of wires on a die increases, the time to pull-test all the wires on the die increases and/or the number of pull-test devices needed increases. Consequently, if a single ribbon or lower number of ribbons are used instead of wires, time and/or costs may decrease. Also, by reducing the number of total bonds or stitches on the die, a lower yield loss potential is possible due to lower chances of forming a faulty or damaging bond on the die. It was also observed that due to the lower pressure, an aluminum ribbon does not penetrate as deep into the metalized area of a die, generally <1 micron, compared to a round wire of comparable hardness (>1 micron, depending on diameter and hardness). This too reduces the risk of damage to the underlying circuitry, offering the potential of a lower yield loss, and therefore of lower cost of manufacturing.

Figure 11:
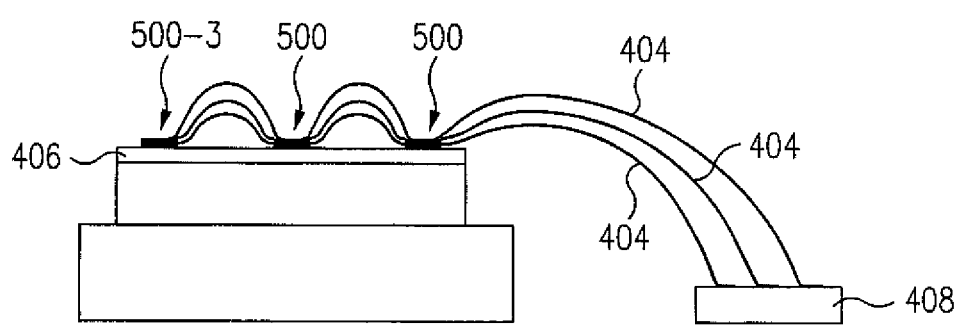
FIG. 11 shows a side view of stacked ribbons according to an embodiment of the present invention.

Another improvement potential the rectangular ribbon geometry offers compared to the round wire geometry is the ability to stack several ribbons on their bonds/stitches over each other, as shown in FIG. 11. Three ribbons 404 are shown stacked on stitches 500. Each subsequently stacked ribbon is bonded, e.g., ultrasonically, to a corresponding underlying bond or stitch 500. This allows the interconnect cross section to be further increased, while still keeping the height comparable that of a wire. For example, up to three 80 mil×8 mil ribbons can be stacked this way in a power module application. With the trend to more efficient power semiconductors, die size is decreasing while current capability remains constant or even increases. This requires larger cross section interconnects. If the width cannot be increased and/or the aspect ratio must be kept at a specific value, stacking will still allow to increase the interconnect cross section. With the present cutting system, the last stitch 500-3 cannot be stacked, as the system needs a support underneath the tool during the cut move, and therefore there would not be sufficient space in a discrete power package for this method. However this limitation could be overcome with an appropriate design of the cut mechanism. Note that this aspect of the invention does not require stacking on ribbons with multiple stitches; stacking over ribbons with a single bonded stitch also provides advantages, as discussed above.

The above-described embodiments of the present invention are merely meant to be illustrative and not limiting. It will thus be obvious to those skilled in the art that various changes and modifications may be made without departing from this invention in its broader aspects. For example, the bonding of a semiconductor die to a package is described above. However, ribbon bonding can also be between two elements in an electronic module, of which one, both, or none are a semiconductor die. Further, the bonding is described primarily with regards to ultrasonic bonding, and to a lesser degree, thermosonic bonding. However, other boding processes that are suitable for use with the flexible ribbon discussed herein may also be used, such as thermocompression. Bonding may be the of the same or different types for both die-to-ribbon and lead-to-ribbon. Therefore, the appended claims encompass all such changes and modifications as fall within the true spirit and scope of this invention.

What is claimed is:

1. A method of providing an electrical interconnection between a first element and a second element, the method comprising the steps of:
  a) ultrasonically bonding a first portion of a ribbon material to a first element using a bonding tool to form a first bonded area, the ribbon material having a rectangular cross section;
  b) extending a length of the ribbon material, continuous with the first portion, to a second element after step a); and
  c) bonding a second portion of the ribbon material to the second element using the bonding tool to form a second bonded area, thereby providing an electrical interconnection between the first element and the second element,
  wherein at least one of the first bonded area and the second bonded area are formed at an angle that is non-perpendicular to a length along which the ribbon material extends from the first element to the second element.

2. The method of claim 1, wherein the ribbon material having the rectangular cross section is provided such that a ratio of a width of the ribbon material to a thickness of the ribbon material is in a range of 7-13.

3. The method of claim 1, wherein step a) includes ultrasonically bonding the first portion of the ribbon material to a semiconductor die supported by a substrate.

4. The method of claim 3, wherein the substrate is a leadframe, and step c) includes bonding the second portion of the ribbon material to a lead of the leadframe.

5. The method of claim 1, wherein each of the first element and the second element comprise a semiconductor die.

6. The method of claim 1, wherein extending the length of the ribbon material includes feeding the length of the ribbon material after step a).

7. The method of claim 6, wherein the feeding the length of the ribbon material includes guiding the length of the ribbon material with a ribbon guide.

8. The method of claim 1, further including the step of:
  d) cutting the ribbon material after step c).

9. The method of claim 1, wherein step b) includes extending the length of the ribbon material such that the length follows an arc shape.

10. The method of claim 1, wherein step a) includes ultrasonically bonding the first portion of the ribbon material to the first element such that the first portion of the ribbon material includes a first bonded portion, a second bonded portion, and a third bonded portion, the first bonded portion being closest to the second element in comparison to a position of the second bonded portion and the third bonded portion, the second bonded portion being positioned between the first bonded portion and the third bonded portion, wherein when measured in a direction along which the ribbon material extends (1) a distance between a centerline of the second bonded portion to a centerline of the first bonded portion is less than (2) a distance between a centerline of the third bonded portion to the centerline of the second bonded portion.

11. The method of claim 1 wherein a thickness of the ribbon material is in a range of between 2-10 mils.

12. The method of claim 1 wherein a width of the ribbon material is in a range of between 20-100 mils.

13. The method of claim 1 wherein step (a) includes ultrasonically bonding the first portion of the ribbon material at a frequency higher than 60 kHz.

14. The method of claim 1 wherein the ribbon material is an aluminum ribbon material.

15. The method of claim 1 wherein the ribbon material is a copper ribbon material.

16. The method of claim 1 wherein the first element is part of a power semiconductor device.

17. The method of claim 1 wherein the first element is part of a power MOSFET.

18. The method of claim 1 wherein the first element is part of a TO-220 semiconductor package.

19. The method of claim 1 wherein the first element is part of an SO-8 semiconductor package.

20. The method of claim 1 wherein the first element is part of an SO-12 semiconductor package.

21. The method of claim 1 wherein the bonded first portion of the ribbon material and the bonded second portion of the ribbon material are formed at different angles from one another.

22. The method of claim 1 wherein step a) includes ultrasonically bonding the first portion of the ribbon material to the first element such that the first portion of the ribbon material includes a first bonded portion, a second bonded portion, and a third bonded portion.

23. The method of claim 22, wherein step a) includes forming a first loop of the ribbon material between the first bonded portion and the second bonded portion, and forming a second loop of the ribbon material between the second bonded portion and the third bonded portion.

24. A method of providing an electrical interconnection between a first element and a second element, the method comprising the steps of:
   a) ultrasonically bonding a first portion of a ribbon material to a first element using a bonding tool to form a first bonded area, the ribbon material having a rectangular cross section;
   b) extending a length of the ribbon material, continuous with the first portion, to a second element after step a); and
   c) bonding a second portion of the ribbon material to the second element using the bonding tool to form a second bonded area, thereby providing an electrical interconnection between the first element and the second element,
   wherein the first bonded area and the second bonded area are formed at different angles from one another.

25. A method of providing an electrical interconnection between a first element and a second element, the method comprising the steps of:
   a) ultrasonically bonding a first portion of a ribbon material to a first element using a bonding tool, the ribbon material having a rectangular cross section;
   b) extending a length of the ribbon material, continuous with the first portion, to a second element after step a); and
   c) bonding a second portion of the ribbon material to the second element using the bonding tool, thereby providing an electrical interconnection between the first element and the second element,
   wherein step a) includes ultrasonically bonding the first portion of the ribbon material to the first element such that the first portion of the ribbon material includes a first bonded portion, a second bonded portion, and a third bonded portion, the first bonded portion being closest to the second element in comparison to a position of the second bonded portion and the third bonded portion, the second bonded portion being positioned between the first bonded portion and the third bonded portion, wherein when measured in a direction along which the ribbon material extends (1) a distance between a centerline of the second bonded portion to a centerline of the first bonded portion is less than (2) a distance between a centerline of the third bonded portion to the centerline of the second bonded portion such that a length of ribbon material between the centerline of the third bonded portion and the centerline of the second bonded portion is greater than a length of ribbon material between the centerline of the second bonded portion and the centerline of the first bonded portion.

* * * * *